US010978328B2

(12) United States Patent
Abe et al.

(10) Patent No.: US 10,978,328 B2
(45) Date of Patent: Apr. 13, 2021

(54) ARTICLE STORAGE FACILITY

(71) Applicant: Daifuku Co., Ltd., Osaka (JP)

(72) Inventors: Takeshi Abe, Hinocho (JP); Tadahiro Yoshimoto, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 49 days.

(21) Appl. No.: 15/697,857

(22) Filed: Sep. 7, 2017

(65) Prior Publication Data

US 2018/0076079 A1 Mar. 15, 2018

(30) Foreign Application Priority Data

Sep. 9, 2016 (JP) .............................. JP2016-176979

(51) Int. Cl.
*H01L 21/677* (2006.01)
*B65G 1/04* (2006.01)
*H01L 21/67* (2006.01)
*H01L 21/673* (2006.01)

(52) U.S. Cl.
CPC ...... *H01L 21/67769* (2013.01); *B65G 1/0407* (2013.01); *H01L 21/67017* (2013.01); *H01L 21/67393* (2013.01)

(58) Field of Classification Search
CPC ............... B62B 3/006; H01L 21/67769; H01L 21/67126; B65G 1/0407; H05K 7/20
See application file for complete search history.

(56) References Cited

U.S. PATENT DOCUMENTS

| 6,682,414 B2 | 1/2004 | Nakao | |
|---|---|---|---|
| 10,274,214 B2 | 4/2019 | Otsuka et al. | |
| 2003/0050005 A1* | 3/2003 | Nakao | H01L 21/67769 454/187 |
| 2015/0004899 A1 | 1/2015 | Otsuka et al. | |
| 2015/0036293 A1* | 2/2015 | Martini | F24F 11/0001 361/695 |
| 2017/0062243 A1* | 3/2017 | Omori | H01L 21/67769 |

FOREIGN PATENT DOCUMENTS

| CN | 1405072 A | 3/2003 |
|---|---|---|
| CN | 104253076 A | 12/2014 |
| JP | 2009184787 A | 8/2009 |
| JP | 20159912 A | 1/2015 |

* cited by examiner

*Primary Examiner* — Saul Rodriguez
*Assistant Examiner* — Willie Berry, Jr.
(74) *Attorney, Agent, or Firm* — The Webb Law Firm

(57) ABSTRACT

A wall member that covers lateral sides of an article storage rack includes a main wall portion that is installed in an orientation in which it extends along a vertical direction at a position that is spaced apart upward from an installation floor, and a sub-wall portion that is installed at a position that is spaced apart upward from the installation floor. An inlet port is formed at an upper end of the main wall portion, a first space surrounded by the main wall portion and a second space directly below the sub-wall portion are in communication with each other, an outlet port is formed below an end portion of the sub-wall portion on a second side, and an end portion of the sub-wall portion on a first side is connected to a lower end of the main wall portion in a state in which the flow of air between the sub-wall portion and the main wall portion is restricted.

12 Claims, 2 Drawing Sheets

ARTICLE STORAGE FACILITY

CROSS-REFERENCE TO RELATED APPLICATION

This application claims priority to Japanese Patent Application No. 2016-176979 filed Sep. 9, 2016, the disclosure of which is hereby incorporated in its entirety by reference.

FIELD OF THE INVENTION

The present invention relates to an article storage facility including an article storage rack and a wall member.

BACKGROUND

JP 2009-184787A discloses an example of an article storage facility including an article storage rack that is installed upright on an installation floor that is configured to restrict the flow of air therethrough and a wall member that covers lateral sides of the article storage rack such that the wall member restricts the flow of air therethrough. In this article storage facility, the wall member (peripheral wall (W)) is formed into a rectangular tubular shape whose upper and lower ends are open. An inlet port through which air flows into a space surrounded by the wall member from above the wall member is formed in the opening at the upper end of the wall member, while the opening at the lower end of the wall member is closed by the installation floor. In addition, an outlet port through which air flows laterally out of the space surrounded by the wall member is formed in a lower end portion of the wall member, and an air blower (fan filter unit 35 for peripheral walls) is provided in the outlet port.

In the above-described article storage facility, since an air blower is provided in the outlet port, the running costs of the article storage facility are high. To address this issue, it is conceivable to not provide the air blower in the outlet port to suppress the running costs, but then the following problems arise. For example, provided that articles stored in the article storage rack are containers that accommodate semiconductor substrates, there are cases where an inert gas, such as nitrogen gas, or the like that is filled into the containers escapes from the containers. If a gas flows out from the containers as described above, the concentration of the gas may increase locally, or in other words, the concentration of oxygen may decrease locally. In the conventional article storage facility, air is forcibly discharged from the outlet port by the air blower, and thus, air is agitated, so that a local decrease in the concentration of oxygen in air that is discharged from the outlet port can be suppressed. However, if an air blower is not provided in the outlet port in order to suppress the running costs, air that flows out from the outlet port is unlikely to be agitated, and flows out of the wall member while the oxygen concentration is locally low.

Thus, there is demand to provide an article storage facility with which a local decrease in oxygen concentration in air flowing out of a wall member can be suppressed while suppressing the running costs.

SUMMARY OF THE INVENTION

In view of the foregoing problems, in an article storage facility including an article storage rack that is installed upright on an installation floor configured to restrict the flow of air therethrough, and a wall member that covers lateral sides of the article storage rack such that the wall member restricts the flow of air therethrough, according to one aspect, the wall member includes a main wall portion that is installed in an orientation in which it extends along a vertical direction at a position that is spaced apart upward from the installation floor and that restricts the flow of air therethrough, and a sub-wall portion that is installed along the installation floor at a position that is spaced apart upward from the installation floor and that restricts the flow of air therethrough, when, with respect to a thickness direction of the main wall portion when viewed in the vertical direction, a side on which the article storage rack is present relative to the main wall portion is referred to as a first side, and a side that is opposite to the first side is referred to as a second side, an inlet port through which air flows into a first space surrounded by the main wall portion from above the main wall portion is formed at an upper end of the main wall portion, the first space and a second space directly below the sub-wall portion are in communication with each other, an outlet port through which air flows out of the second space toward the second side of the sub-wall portion is formed below an end portion of the sub-wall portion on the second side, and an end portion of the sub-wall portion on the first side is connected to a lower end of the main wall portion in a state in which the flow of air between the sub-wall portion and the main wall portion is restricted.

With this configuration, air flowing into the first space through the inlet port, which is formed at the upper end of the main wall portion, flows downward, and then flows below the sub-wall portion toward the second side. The air flows through the second space directly below the sub-wall portion, and then, flows to the outside of the wall member through the outlet port, which is formed below the end portion of the sub-wall portion. That is to say, instead of flowing to the outside of the wall member directly from the main wall portion, the air within the wall member flows to the outside of the wall member after flowing through the second space, which is formed by providing the sub-wall portion. Thus, the air is agitated while flowing through the second space. In this manner, air can be agitated using the second space directly below the sub-wall portion and without having to provide an air blower, so that the oxygen concentration in air flowing out through the outlet port can be uniformized. Accordingly, a local decrease in oxygen concentration in the air flowing out of the wall member can be suppressed while suppressing the running costs.

Other features and advantages of the article storage facility will become clearer from the following explanation of embodiments that will be described with reference to the drawings.

DETAILED DESCRIPTION

Figure 1:
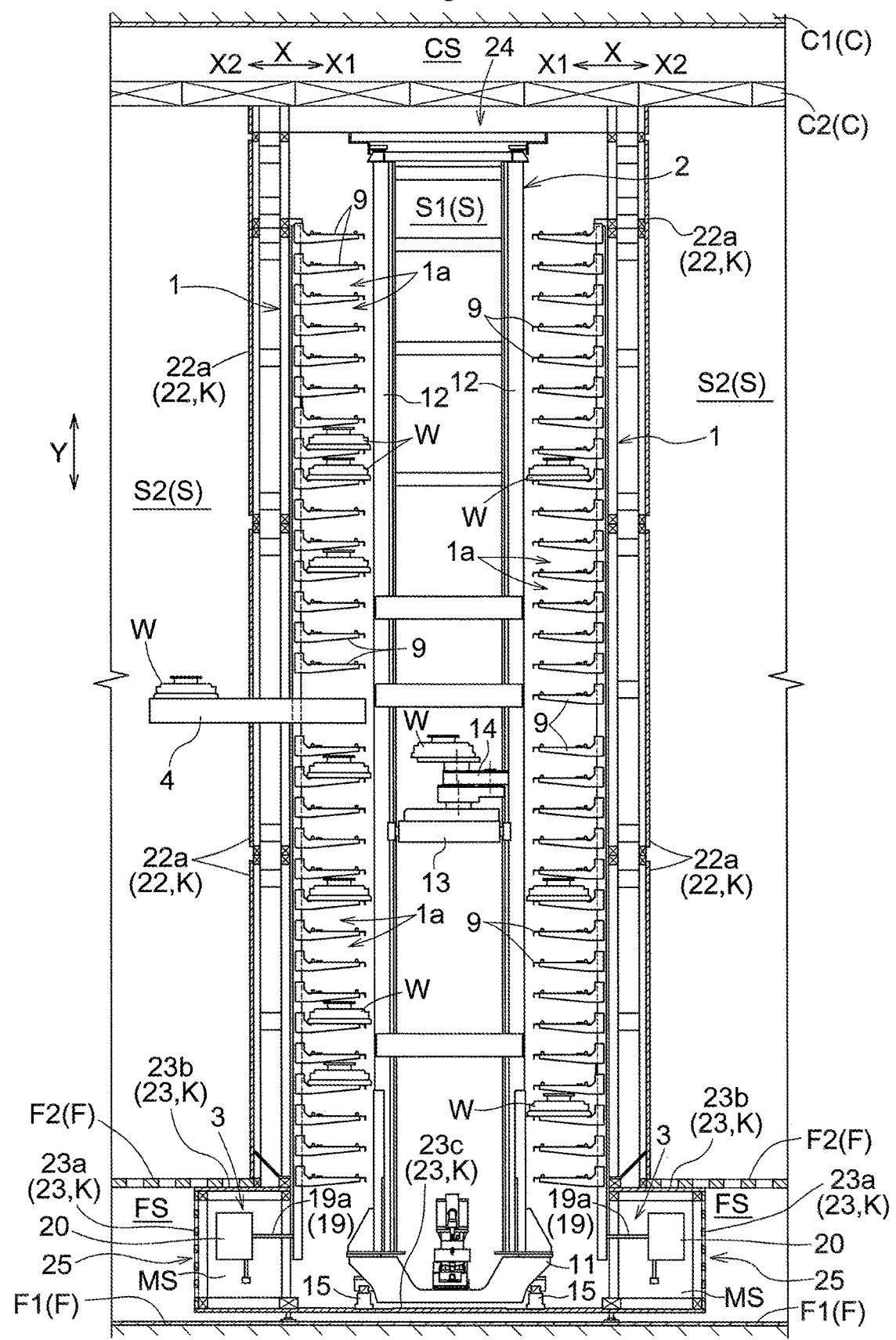
FIG. 1 is a front view of an article storage facility.

Hereinafter, an embodiment of an article storage facility according to the present invention will be described based on the drawings. As shown in FIG. 1, the article storage facility includes article storage racks 1 for storing containers W, which serve as articles, a stacker crane 2 for transporting containers W, and inert gas supply apparatuses 3. Also, the article storage facility includes a wall member K that covers lateral sides of an internal space S1 in which the article storage racks 1 and the stacker crane 2 are installed such that the wall member K restricts the flow of air therethrough, and pickup/dropoff apparatuses 4 for transporting containers W, the pickup/dropoff apparatuses 4 being installed penetrating the wall member K.

Each article storage rack 1 includes a plurality of storage portions 1a for storing containers W. Each inert gas supply apparatus 3 is configured to supply an inert gas (more specifically, nitrogen gas), which serves as a gas, into containers W stored in the respective storage portions 1a. Each container W is configured to be capable of accommodating a single substrate. In the present embodiment, it is assumed that the substrate is a reticle for EUV lithography, and the container W is a container W that accommodates a reticle.

Each pickup/dropoff apparatus 4 is installed so as to transport containers W between its outside portion that is located outside the wall member K and its inside portion that is located inside the wall member K. The pickup/dropoff apparatuses 4 are installed at a high position and a low position, respectively, such that an overhead transport vehicle (not shown) picks up/drops off containers W from/onto the outside portion of the pickup/dropoff apparatus 4 that is installed at the high position, and a worker picks up/drops off containers W from/onto the outside portion of the pickup/dropoff apparatus 4 that is installed at the low position. It should be noted that the pickup/dropoff apparatus 4 that is installed at the low position is not shown in the drawings. The stacker crane 2 transports containers W from the inside portions of the pickup/dropoff apparatuses 4 to the storage portions 1a of the article storage racks 1 and transports containers W from the storage portions 1a of the article storage racks 1 to the inside portions of the pickup/dropoff apparatuses 4.

The article storage facility is installed in a downflow clean room in which a gas flows downward from the ceiling side toward the floor side within a room space S. A floor portion F of the clean room includes a lower floor portion F1 and an upper floor portion F2 that is installed above the lower floor portion F1. The lower floor portion F1 is a floor that has no vent holes and does not allow air to pass through, while the upper floor portion F2 is a floor that has vent holes and allows air to pass through in a vertical direction Y. In the present embodiment, the lower floor portion F1 is composed of non-porous concrete, and the stacker crane 2 travels on the lower floor portion F1. Moreover in the present embodiment, the upper floor portion F2 is composed of a grate in which a plurality of vent holes penetrating the grate in the vertical direction Y are formed, and a worker walks on the upper floor portion F2.

A ceiling portion C of the clean room is constituted by an upper ceiling portion C1 and a lower ceiling portion C2 that is installed below the upper ceiling portion C1. The upper ceiling portion C1 is a ceiling that has no vent holes and does not allow air to pass through, while the lower ceiling portion C2 is a ceiling that allows air to pass through in the vertical direction Y. In the present embodiment, the upper ceiling portion C1 is composed of non-porous concrete, and the lower ceiling portion C2 is composed of a filter such as a HEPA filter.

It should be noted that the lower ceiling portion C2 provided with the filter corresponds to a ceiling that is provided with a discharge portion from which clean air is discharged downward. The lower floor portion F1 corresponds to an installation floor that is configured not to allow air to pass through in the vertical direction Y, and is configured to restrict the flow of air therethrough by being configured not to allow air to pass through. The upper floor portion F2 corresponds to an operation floor that is installed below the lower ceiling portion C2 and above the lower floor portion F1 and that is configured to allow air to pass through in the vertical direction Y.

A floor space FS is formed between the lower floor portion F1 and the upper floor portion F2, and a ceiling space CS is formed between the upper ceiling portion C1 and the lower ceiling portion C2. Moreover, the room space S is formed between the upper floor portion F2 and the lower ceiling portion C2. When an air blower, which is not shown, is operated, thereby delivering air (clean air) into the ceiling space CS, the air flows downward from the ceiling portion C toward the floor portion F within the room space S.

Containers

Each container W is provided with an air supply portion (not shown) and an air discharge portion (not shown) in its bottom portion. The air supply portion is a portion through which inert gas that has been delivered from a connection portion (not shown) of a corresponding one of the inert gas supply apparatuses 3 is supplied into the container W. The air discharge portion is a portion through which gas inside the container W is discharged to the outside of that container W. The air supply portion of each container W is biased into a closed state by a biasing member such as a spring. In a state in which the connection portion of the inert gas supply apparatus 3 is connected to the air supply portion of the container W, when the inert gas is ejected from that connection portion, the pressure of the ejected inert gas opens the air supply portion, and the inert gas is supplied into the container W. Also, the air discharge portion of each container W is biased into a closed state by a biasing member such as a spring. When the inert gas is supplied by the inert gas supply apparatus 3 and increases the pressure inside the container W, the increased pressure opens the air discharge portion, and the gas inside the container W is discharged through the air discharge portion.

Hereinafter, various components of the article storage facility will be described. It should be noted that, in the following description, when viewed in the longitudinal direction of the article storage racks 1 (travelling direction in which the stacker crane 2 travels), a direction in which each article storage rack 1 and the stacker crane 2 are lined up is referred to as "front-rear direction X", a side on which the stacker crane 2 is present relative to the article storage rack 1 is referred to as "inward side X1", and a side that is opposite to the inward side X1 is referred to as "outward side X2".

Article Storage Racks

As shown in FIG. 1, a pair of article storage racks 1 are installed opposing each other. Each article storage rack 1 includes a plurality of storage portions 1a that are lined up in the vertical direction Y and the longitudinal direction. Each of the plurality of storage portions 1a includes a support portion 9 that supports a container W from below, and each storage portion 1a is adapted to store a container W in a state in which the container W is supported by the support portion 9 from below. The support portion 9 supports a connection portion (not shown) that is to be connected to a container W when the container W is stored in the storage portion 1a. This connection portion is provided at a location where it is connected to the air supply portion of a container W in a state in which the container W is supported by the support portion 9.

That is to say, when a container W is stored in a given storage portion 1a and supported by the support portion 9, a corresponding one of the inert gas supply apparatuses 3 is connected to the container W. Then, in the state in which the container W is supported by the support portion 9, the inert gas is delivered from the connection portion of the inert gas supply apparatus 3. As a result, the inert gas is supplied into the container W through the air supply portion of the container W, and the gas inside the container W is discharged from the air discharge portion of the container W.

Each article storage rack 1 is installed upright on the lower floor portion F1 in a state in which it vertically penetrates the upper floor portion F2, and is installed in a state in which the entire article storage rack 1 is located above the lower floor portion F1, and the article storage rack 1 is partially located above the upper floor portion F2. That is to say, each article storage rack 1 is installed extending in both the room space S (internal space S1) and the floor space FS. Moreover, an upper end portion of each article storage rack 1 is connected to the lower ceiling portion C2.

Of the plurality of storage portions 1*a* included in each article storage rack 1, a storage portion 1*a* that is located at the bottom will be referred to as "lowermost storage portion 1*a*". The support portion 9 included in the lowermost storage portion 1*a* is installed such that its upper surface is level with the upper surface of the upper floor portion F2. The support portions 9 included in the storage portions 1*a* other than the lowermost storage portion 1*a* are disposed so as to be located above the upper floor portion F2. It should be noted that the lowermost storage portion 1*a* may also be located partially or entirely below the upper surface of the upper floor portion F2 by installing the support portion 9 included in the lowermost storage portion 1*a* such that its upper surface is lower than the upper surface of the upper floor portion F2.

Stacker Crane

As shown in FIG. 1, the stacker crane 2 is installed so as to be movable in the travelling direction (hereinafter referred to as "longitudinal direction") between the pair of article storage racks 1. The stacker crane 2 includes a travelling truck 11 that travels in the longitudinal direction in front of the article storage racks 1, masts 12 that are provided upright on the travelling truck 11, an elevation body 13 that moves up and down along the masts 12, and a transfer device 14 that is supported by the elevation body 13. It should be noted that the stacker crane 2 corresponds to a transport apparatus for transporting containers W (articles) to and from the article storage racks 1.

When the travelling truck 11 travels, the transfer device 14 moves along the longitudinal direction accordingly, and when the elevation body 13 moves up or down, the transfer device 14 moves in the vertical direction Y along the masts 12 accordingly. Although not described in detail, the transfer device 14 includes a support for supporting a container W and a link mechanism that moves the support along the front-rear direction, and the transfer device 14 is configured to be capable of transferring containers W between itself and the storage portions 1*a* and between itself and the pickup/dropoff apparatuses 4. The stacker crane 2 transports containers W from the pickup/dropoff apparatuses 4 to the storage portions 1*a* and transports containers W from the storage portions 1*a* to the pickup/dropoff apparatuses 4, by making the travelling truck 11 travel, moving the elevation body 13 up and down, and operating the transfer device 14 to perform the transfer.

The travelling truck 11 travels on travelling rails 15 along the travelling rails 15. With regard to the travelling truck 11, at least a portion of the travelling truck 11 is located below the support portion 9 included in the lowermost storage portion 1*a*. In the present embodiment, the entire travelling truck 11 is located below the support portion 9 included in the lowermost storage portion 1*a* and also below the upper floor portion F2.

Inert Gas Supply Apparatuses

The inert gas supply apparatuses 3 supply inert gas into the containers W stored in the storage portions 1*a*. Each inert gas supply apparatus 3 includes a pipe 19 provided with connection portions at its leading ends and mass flow controllers 20 that regulate the flow rate of the inert gas delivered from the connection portions. The pipe 19 includes main pipes 19*a* and branch pipes (not shown) that branch off from the main pipes 19*a*, and the connection portions are provided at leading ends of the branch pipes. One main pipe 19*a* is provided for each column in each of the article storage racks 1, and connected to the main pipe 19*a* are a plurality of branch pipes that are respectively provided for a plurality of storage portions 1*a* lined up in the vertical direction Y in the single column. The inert gas supplied from a supply source (not shown) flows through the pipe 19 and is divided between and supplied to the plurality of connection portions. The mass flow controllers 20 control the flow rate of the inert gas that flows through the main pipes 19*a*, and one mass flow controller 20 is provided for each column in each of the article storage racks 1. Incidentally, although one mass flow controller 20 is installed for thirty-one storage portions 1*a* that are lined up in the vertical direction Y in the present embodiment, a configuration may also be adopted in which two or more main pipes 19*a* are installed for a single column in each of the article storage racks 1, and two or more mass flow controllers 20 are installed for thirty-one storage portions 1*a* that are lined up in the vertical direction Y.

Wall Member

Figure 2:
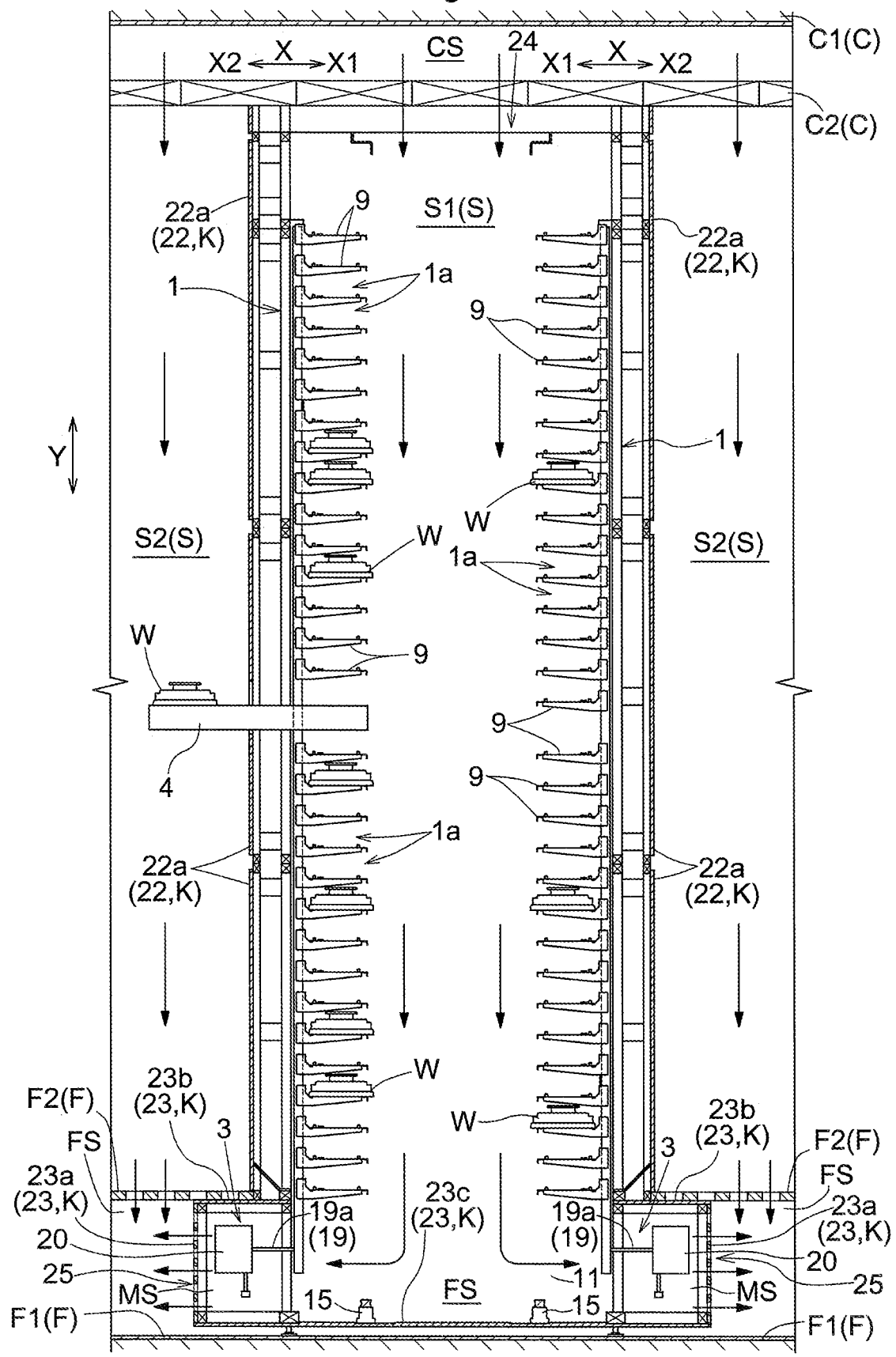
FIG. 2 is a diagram illustrating airflows in the article storage facility.

As shown in FIGS. 1 and 2, an overfloor wall 22 and an underfloor wall 23 are provided. The overfloor wall 22 is located above the upper floor portion F2 and below the lower ceiling portion C2, and is installed on the lateral sides of the article storage racks that are within the room space S in a state in which it restricts the flow of air. The underfloor wall 23 is located below the upper floor portion F2 and above the lower floor portion F1, and is installed within the floor space FS. The underfloor wall 23 is formed to be wider than the overfloor wall 22 in the front-rear direction X, and the wall member K as a whole is formed into an inverted T-shape when viewed in the longitudinal direction. It should be noted that, in FIGS. 1 and 2, the front-rear direction X corresponds to the thickness direction of the overfloor wall 22 when viewed in the vertical direction Y. Moreover, the inward side X1 corresponds to a first side that is a side on which the article storage racks 1 are present relative to the overfloor wall 22, and the outward side X2 corresponds to a second side that is opposite to the first side.

The overfloor wall 22 is formed into a rectangular tubular shape with the hollow space passing therethrough in the vertical direction Y. More specifically, an overfloor wall portion 22*a* that blocks one side of the internal space S1 with respect to the longitudinal direction, an overfloor wall portion 22*a* that blocks the other side of the internal space S1 with respect to the longitudinal direction, an overfloor wall portion 22*a* that blocks one side of the internal space S1 with respect to the front-rear direction X, and an overfloor wall portion 22*a* that blocks the other side of the internal space S1 with respect to the front-rear direction X are provided. FIGS. 1 and 2 show the overfloor wall portion 22*a* that blocks the one side of the internal space S1 with respect to the front-rear direction X and the overfloor wall portion 22*a* that blocks the other side of the internal space S1 with respect to the front-rear direction X. It should be noted that the overfloor wall 22 corresponds to a main wall portion that is installed in an orientation in which it extends along the vertical direction Y at a position that is spaced apart upward from the lower floor portion F1.

It should be noted that with regard to the lateral sides of the internal space S1, it is not necessary to provide an overfloor wall portion 22a in a portion in which the flow of air from the internal space S1 to an external space S2 is restricted even without an overfloor wall portion 22a because of, for example, the presence of a wall of the clean room. Moreover, openings for installation of the pickup/dropoff apparatuses and the like are formed in the overfloor wall 22 as necessary, and even when an opening whose main purpose is not ventilation, but is for the installation of an apparatus or to allow the passage of articles, for example, is formed in the overfloor wall 22, the overfloor wall 22 is regarded as being configured to restrict the flow of air therethrough. Moreover, the overfloor wall 22 may also be formed into a shape, such as a circular tubular shape, other than a rectangular tubular shape. That is to say, "being configured to restrict the flow of air therethrough" includes not only the case where the overfloor wall 22 is configured not to allow air to pass through, but also a configuration in which the overfloor wall 22 partially allows air to pass through as in the case where an opening whose main purpose is not to allow air to flow through is formed, the case where a gap is formed between a given article storage rack 1 and a corresponding one of the overfloor wall portions 22a due to an installation error or the like, and other cases.

The upper end of the overfloor wall 22 is in contact with the lower ceiling portion C2, and the lower end of the overfloor wall 22 is in contact with the upper floor portion F2. The overfloor wall 22 partitions the room space S between the lower ceiling portion C2 and the upper floor portion F2 into the internal space S1, which is a space inside the overfloor wall 22 and in which the article storage racks 1 and the stacker crane 2 are installed, and the external space S2, which is a space outside the overfloor wall 22. The overfloor wall 22 is installed in a state in which it is coupled to frames of the article storage racks 1. It should be noted that the overfloor wall 22 may also be installed without being coupled to the article storage racks 1, by installing the overfloor wall 22 upright on the upper floor portion F2, for example. Moreover, the overfloor wall 22 may also be installed in a state in which its upper end is spaced apart downward from the lower ceiling portion C2, and it is sufficient if the upper end of the overfloor wall 22 is located higher than the upper end of a container W supported by the uppermost support portion 9.

The underfloor wall 23 is formed into a rectangular box-like shape whose upper surface is partially open. More specifically, the underfloor wall 23 includes underfloor wall portions 23a that together form a rectangular tubular shape and respectively constitute four faces, as well as a pair of shut-off wall portions 23b that form an upper surface and a bottom wall portion 23c that forms a lower surface. FIGS. 1 and 2 show the underfloor wall portion 23a that blocks one side with respect to the front-rear direction X, the underfloor wall portion 23a that blocks the other side with respect to the front-rear direction X, the pair of shut-off wall portions 23b that form the upper surface, and the bottom wall portion 23c that forms the lower surface. The pair of shut-off wall portions 23b that form the upper surface of the underfloor wall 23 are installed along the lower floor portion F1 at a position that is spaced apart upward from the lower floor portion F1, and are configured not to allow air to pass through. It should be noted that the shut-off wall portions 23b correspond to a sub-wall portion that restricts the flow of air therethrough.

An end portion of each shut-off wall portion 23b on the inward side X1 is located between an inner surface of a corresponding one of the underfloor wall portions 23a and an outer end of the corresponding support portions 9 with respect to the front-rear direction X, and an end portion of that shut-off wall portion 23b on the outward side X2 is located on the outward side X2 of an outer surface of that underfloor wall portion 23a. An outlet port 25 that is open toward the outward side X2 is formed in an end portion of the underfloor wall 23 on the outward side X2, and the outlet port 25 is closed by a corresponding one of the underfloor wall portions 23a that allows air to pass through in the front-rear direction. That is to say, the outlet port 25 through which air flows out is formed in the end portion of the underfloor wall 23 on the outward side X2, and the outlet port 25 is partially closed by the underfloor wall portion 23a. It should be noted that the underfloor wall portion 23a corresponds to a closing plate material.

The opening that is formed at the lower end of the overfloor wall 22 and the opening that is formed in the upper surface of the underfloor wall 23 are connected to each other via the upper floor portion F2, and thus, the internal space S1 surrounded by the overfloor wall 22 is in communication with an agitation space MS directly below each shut-off wall portion 23b. Moreover, an inlet port 24 through which air flows into the internal space S1 from above the overfloor wall 22 is formed at the upper end of the overfloor wall 22. Furthermore, the outlet port 25, through which air flows out of the agitation space MS to the outward side X2 of the underfloor wall 23, is formed in the end portion of the underfloor wall 23 on the outward side X2. The outlet port 25 is formed at a position below an end portion of each shut-off wall portion 23b on the outward side X2.

In addition, a portion of each shut-off wall portion 23b that is located on the inward side X1 is connected to the lower end of the overfloor wall 22 in a state in which the flow of air between the shut-off wall portion 23b and the overfloor wall 22 is restricted. More specifically, each shut-off wall portion 23b is coupled to the lower surface of the upper floor portion F2, and the lower end of each overfloor wall portion 22a of the overfloor wall 22 is coupled to the upper surface of the upper floor portion F2. In this manner, the upper floor portion F2 is sandwiched between the lower end of each overfloor wall portion 22a of the overfloor wall 22 and the upper surface of each shut-off wall portion 23b. In this state, the overfloor wall 22 and the shut-off wall portions 23b are installed. Thus, the flow of air between the overfloor wall 22 and the shut-off wall portions 23b is restricted. It should be noted that the end portion of each shut-off wall portion 23b on the inward side X1 is a portion that is one-third of that shut-off wall portion 23b from its end on the inward side X1.

Mass Flow Controllers

Each mass flow controller 20 is located entirely on the outward side X2 of the end of a corresponding one of the shut-off wall portions 23b on the inward side X1, and located entirely on the inward side X1 of the end of the shut-off wall portion 23b on the outward side X2. Also, each mass flow controller 20 is installed such that its entirety is located within the agitation space MS. Moreover, each mass flow controller 20 is located on the outward side X2 of the corresponding support portions 9 so that it does not overlap those support portions 9 when viewed in the vertical direction Y.

Air that is discharged downward from the lower ceiling portion C2 flows downward within the room space S (internal space S1 and external space S2). In the external space S2, the air flows downward within the external space S2, and then flows into the floor space FS through the upper floor portion F2. In the internal space S1, the air discharged downward from the lower ceiling portion C2 flows into the internal space S1 through the inlet port 24, which is formed at the upper end of the overfloor wall 22 of the wall member K, then flows downward on the inside of the overfloor wall 22, and flows into the floor space FS from the internal space S1. After that, the air flows toward the outward side X2 within the floor space FS, passes through the agitation spaces MS, and then flows to the outside of the wall member K from the outlet ports 25 through the underfloor wall portions 23a. In this manner, air is made to flow to the outside of the wall member K after flowing through the agitation spaces MS, which are formed by providing the respective shut-off wall portions 23b. Therefore, the air is agitated while flowing through the agitation spaces MS. Thus, a local decrease in oxygen concentration in the air flowing out of the wall member K can be suppressed.

Other Embodiments (1) In the foregoing embodiment, the underfloor wall 23 is formed into a rectangular box-like shape whose upper surface is partially open. However, the underfloor wall 23 may also be formed into a plate-like shape by being constituted only by shut-off wall portions.

(2) In the foregoing embodiment, the underfloor wall includes the underfloor wall portions, and the outlet ports are partially closed by the respective underfloor wall portions. However, a configuration may also be adopted in which the underfloor wall includes no underfloor wall portion, and the outlet ports are not closed by any underfloor wall portion.

(3) In the foregoing embodiment, the operation floor is provided in addition to the shut-off wall portions. However, a configuration may also be adopted in which only the shut-off wall portions are provided, and a worker can walk on the shut-off wall portions.

(4) In the foregoing embodiment, a downflow method is employed to cause air to flow in through the inlet port. However, a configuration may also be adopted in which a fan filter unit is provided in the inlet port to cause air to flow in through the inlet port.

Overview of Embodiments

Hereinafter, an overview of the above-described article storage facility will be described briefly.

According to one aspect, in an article storage facility including an article storage rack that is installed upright on an installation floor configured to restrict the flow of air therethrough, and a wall member that covers lateral sides of the article storage rack such that the wall member restricts the flow of air therethrough, the wall member includes a main wall portion that is installed in an orientation in which it extends along a vertical direction at a position that is spaced apart upward from the installation floor and that restricts the flow of air therethrough, and a sub-wall portion that is installed along the installation floor at a position that is spaced apart upward from the installation floor and that restricts the flow of air therethrough, when, with respect to a thickness direction of the main wall portion when viewed in the vertical direction, a side on which the article storage rack is present relative to the main wall portion is referred to as a first side, and a side that is opposite to the first side is referred to as a second side, an inlet port through which air flows into a first space surrounded by the main wall portion from above the main wall portion is formed at an upper end of the main wall portion, the first space and a second space directly below the sub-wall portion are in communication with each other, an outlet port through which air flows out of the second space toward the second side of the sub-wall portion is formed below an end portion of the sub-wall portion on the second side, and an end portion of the sub-wall portion on the first side is connected to a lower end of the main wall portion in a state in which the flow of air between the sub-wall portion and the main wall portion is restricted.

With this configuration, air flowing into the first space through the inlet port, which is formed at the upper end of the main wall portion, flows downward, and then flows below the sub-wall portion toward the second side. The air flows through the second space directly below the sub-wall portion, and then, flows to the outside of the wall member through the outlet port, which is formed below the end portion of the sub-wall portion. That is to say, instead of flowing to the outside of the wall member directly from the main wall portion, the air within the wall member flows to the outside of the wall member after flowing through the second space, which is formed by providing the sub-wall portion. Thus, the air is agitated while flowing through the second space. In this manner, air can be agitated using the second space directly below the sub-wall portion and without having to provide an air blower, so that the oxygen concentration in air flowing out through the outlet port can be uniformized. Accordingly, a local decrease in oxygen concentration in the air flowing out of the wall member can be suppressed while suppressing the running costs.

Here, it is preferable if the article storage rack includes a plurality of storage portions for storing containers serving as articles, the article storage facility further includes an inert gas supply apparatus for supplying an inert gas into containers stored in the storage portions, the inert gas supply apparatus includes a flow rate regulating apparatus for regulating a supply amount of the inert gas that is supplied to the storage portions, and the flow rate regulating apparatus is installed between the sub-wall portion and the installation floor such that at least a portion of the flow rate regulating apparatus is located on the second side of the main wall portion, and at least a portion of the flow rate regulating apparatus is located on the first side of the end portion of the sub-wall portion on the second side.

With this configuration, oxidation of accommodated objects (e.g., semiconductor substrates) accommodated in the containers can be prevented by supplying the inert gas into the containers stored in the storage portions through an inert gas supply path. Moreover, as a result of supplying the inert gas into the containers stored in the storage portions in this manner, gas that is present in the containers flows out of the containers in accordance with the supply of the inert gas into the containers. Then, there are cases where the inert gas that has flowed out as described above gathers, and the concentration of the inert gas thus locally increases. However, a local decrease in the oxygen concentration in the air flowing out of the wall member can be suppressed by causing the air to flow to the outside of the wall member through the discharge portion after being agitated in the second space.

Moreover, it is preferable if the plurality of storage portions individually include support portions for supporting the containers from below, and the flow rate regulating apparatus is installed on the second side of the support portions so as not to overlap the support portions when viewed in the vertical direction.

With this configuration, even when the height of the support portions is lowered, the support portions do not interfere with the flow rate regulating apparatus, and therefore, a support portion can be installed at a height between the sub-wall portion and the installation floor while installing the flow rate regulating apparatus between the sub-wall portion and the installation floor. Moreover, although it is conceivable that, if the flow rate regulating apparatus is installed such that it overlaps the support portions when viewed in the vertical direction, air heated by the flow rate regulating apparatus rises and heats the containers stored in the storage portions, the heating of the containers can be suppressed by installing the flow rate regulating apparatus such that it does not overlap the support portions when viewed in the vertical direction.

Moreover, it is preferable if a transport apparatus for transporting articles to and from the article storage rack is installed inside the wall member.

With this configuration, although there is a risk that the operation of the transport apparatus may cause air within the wall member to be forced out through an outlet port, and the air flowing out through the outlet port may flow upward, the air can be prevented from flowing near the article storage rack by providing the sub-wall portion and forming the outlet port in the end portion of the sub-wall portion on the second side. Therefore, even if a worker who performs the operation of transferring articles into and from the article storage rack is near the wall member, air flows upward at a location shifted to the second side from the location of the worker, so that the effect of the air that has flowed out on the worker can be suppressed.

Moreover, it is preferable if the wall member is installed directly below a ceiling that is provided with a discharge portion from which clean air is discharged downward.

With this configuration, the clean air discharged downward from the discharge portion of the ceiling can be caused to flow in through the inlet port at the upper end of the wall member. Therefore, there is no need to provide an air blower for causing air to flow in, in the inlet port of the wall member, and thus, the cost of the article storage rack can be suppressed.

Moreover, it is preferable if the outlet port is partially closed by a closing plate material.

With this configuration, since the outlet port is partially closed by the closing plate material, the second space functions as a chamber, so that the agitation of air in the second space can be promoted.

Moreover, it is preferable if the article storage facility further includes an operation floor on which a worker can walk and through which air can flow in the vertical direction, the operation floor being provided above the sub-wall portion, the sub-wall portion is installed in a state in which it is aligned with the operation floor in the vertical direction, and, in a portion of the operation floor that is aligned with the sub-wall portion in the vertical direction, the flow of air therethrough in the vertical direction is restricted by the sub-wall portion.

With this configuration, since the operation floor is installed above the sub-wall portion, which is installed at a position that is spaced apart upward from the installation floor, the worker can perform operations on high portions of the article storage rack. Moreover, since the second space can be formed using a space below the operation floor, a second space that is unlikely to obstruct the surroundings can be formed. Furthermore, since the flow of air through the portion of the operation floor that is aligned with the sub-wall portion in the vertical direction is restricted by the sub-wall portion, the second space can be formed below the operation floor without making any change to the operation floor.

The invention claimed is:

1. An article storage facility comprising:
   an article storage rack that is installed upright on an installation floor configured to restrict the flow of air therethrough; and
   a wall member that covers lateral sides of the article storage rack such that the wall member restricts the flow of air therethrough,
   wherein:
   the wall member includes a main wall portion that is installed in an orientation in which it extends along a vertical direction at a position that is spaced apart upward from the installation floor and that restricts the flow of air therethrough, and a sub-wall portion that is installed along the installation floor at a position that is spaced apart upward from the installation floor and that restricts the flow of air therethrough,
   when, with respect to a thickness direction of the main wall portion when viewed in the vertical direction, a side on which the article storage rack is present relative to the main wall portion is referred to as a first side, and a side that is opposite to the first side is referred to as a second side,
   the main wall portion is installed directly below a ceiling that is provided with at least one discharge portion from which clean air is discharged downward on both the first side and the second side, an inlet port through which air discharged on the first side flows into a first space surrounded by the main wall portion from above the main wall portion is formed at an upper end of the main wall portion,
   the first space and a second space directly below the sub-wall portion are in communication with each other,
   an outlet port through which air discharged on the first side flows out of the second space, combining with the air discharged on the second side, parallel to the sub-wall portion on the second side of the sub-wall portion, the outlet port is formed below a first end portion of the sub-wall portion on the second side, and
   a second end portion of the sub-wall portion on the first side is connected to a lower end of the main wall portion in a state in which the flow of air between the sub-wall portion and the main wall portion is restricted.

2. The article storage facility according to claim 1, wherein:
   the article storage rack includes a plurality of storage portions for storing containers serving as articles,
   the article storage facility further comprises an inert gas supply apparatus for supplying an inert gas into containers stored in the storage portions,
   the inert gas supply apparatus includes a flow rate regulating apparatus for regulating a supply amount of the inert gas that is supplied to the storage portions, and
   the flow rate regulating apparatus is installed between the sub-wall portion and the installation floor such that at least a portion of the flow rate regulating apparatus is located on the second side of the main wall portion, and at least a portion of the flow rate regulating apparatus is located on the first side of the end portion of the sub-wall portion on the second side.

3. The article storage facility according to claim 2, wherein a transport apparatus for transporting articles to and from the article storage rack is installed inside the wall member.

4. The article storage facility according to claim 2, wherein the outlet port is partially closed by a closing plate material.

5. The article storage facility according to claim 2, further comprising:
- an operation floor on which a worker can walk and through which air can flow in the vertical direction, the operation floor being provided above the sub-wall portion,
- wherein the sub-wall portion is installed in a state in which it is aligned with the operation floor in the vertical direction, and
- wherein in a portion of the operation floor that is aligned with the sub-wall portion in the vertical direction, the flow of air therethrough in the vertical direction is restricted by the sub-wall portion.

6. The article storage facility according to claim 2, wherein the plurality of storage portions individually include support portions for supporting the containers from below, and
- wherein the flow rate regulating apparatus is installed on the second side of the support portions so as not to overlap the support portions when viewed in the vertical direction.

7. The article storage facility according to claim 6, wherein a transport apparatus for transporting articles to and from the article storage rack is installed inside the wall member.

8. The article storage facility according to claim 6, wherein the outlet port is partially closed by a closing plate material.

9. The article storage facility according to claim 6, further comprising:
- an operation floor on which a worker can walk and through which air can flow in the vertical direction, the operation floor being provided above the sub-wall portion,
- wherein the sub-wall portion is installed in a state in which it is aligned with the operation floor in the vertical direction, and
- wherein in a portion of the operation floor that is aligned with the sub-wall portion in the vertical direction, the flow of air therethrough in the vertical direction is restricted by the sub-wall portion.

10. The article storage facility according to claim 1, wherein a transport apparatus for transporting articles to and from the article storage rack is installed inside the wall member.

11. The article storage facility according to claim 1, wherein the outlet port is partially closed by a closing plate material.

12. The article storage facility according to claim 1, further comprising:
- an operation floor on which a worker can walk and through which air can flow in the vertical direction, the operation floor being provided above the sub-wall portion,
- wherein the sub-wall portion is installed in a state in which it is aligned with the operation floor in the vertical direction, and
- wherein in a portion of the operation floor that is aligned with the sub-wall portion in the vertical direction, the flow of air therethrough in the vertical direction is restricted by the sub-wall portion.

* * * * *